US012584242B2

(12) United States Patent
Cheng et al.

(10) Patent No.: US 12,584,242 B2
(45) Date of Patent: Mar. 24, 2026

(54) DEFORMATION COMPENSATION METHOD FOR GROWING THICK GALIUM NITRIDE ON SILICON SUBSTRATE

(71) Applicant: Robert Bosch GmbH, Stuttgart (DE)

(72) Inventors: Bo Cheng, Malden, MA (US); Mordechai Kornbluth, Brighton, MA (US); Charles Tuffile, Swansea, MA (US); Jens Baringhaus, Sindelfingen (DE); Christian Huber, Ludwigsburg (DE)

(73) Assignee: Robert Bosch GmbH (DE)

( * ) Notice: Subject to any disclaimer, the term of this patent is extended or adjusted under 35 U.S.C. 154(b) by 530 days.

(21) Appl. No.: 18/106,732

(22) Filed: Feb. 7, 2023

(65) Prior Publication Data

US 2024/0263348 A1    Aug. 8, 2024

(51) Int. Cl.
H01L 21/02 (2006.01)
C30B 25/16 (2006.01)
(Continued)

(52) U.S. Cl.
CPC ............ C30B 25/16 (2013.01); C30B 25/183 (2013.01); C30B 29/406 (2013.01);
(Continued)

(58) Field of Classification Search
CPC ............ H01L 21/022; H01L 21/02381; H01L 21/02458; H01L 21/02502; H01L 21/0254;
(Continued)

(56) References Cited

U.S. PATENT DOCUMENTS

| | | | | |
|---|---|---|---|---|
| 9,650,723 B1 * | 5/2017 | D'Evelyn | ................ | C30B 9/00 |
| 2018/0204941 A1 * | 7/2018 | Odnoblyudov | ... | H01L 21/02002 |
| 2025/0015085 A1 * | 1/2025 | Hagimoto | .............. | H10D 86/00 |

FOREIGN PATENT DOCUMENTS

| | | | | |
|---|---|---|---|---|
| CN | 114613847 B * | 8/2022 | ........... | C23C 16/303 |
| WO | WO-2022011641 A1 * | 1/2022 | ............. | H01L 21/20 |

* cited by examiner

*Primary Examiner* — Eliseo Ramos Feliciano
*Assistant Examiner* — Timothy Edward Duren
(74) *Attorney, Agent, or Firm* — Dickinson Wright PLLC

(57) ABSTRACT

A method of manufacturing a structure for power electronics which includes epitaxially growing a GaN semiconductor layer is provided. The method includes growing buffer layers formed of AlN and $Al_xGa_{(1-x)}N$, wherein $0<x<1$, on a Si substrate before growing the semiconductor layer on the buffer layers. The method also includes growing deformation compensation layers formed of $SiO_2$, $SiC_xN_{(1-x)}$, SiN, $SiC_xO_{(1-x)}$, SiC, $SiN_xO_{(1-x)}$, $Al_2O_3$, and/or $Cr_2O_3$, wherein $0<x<1$, on the substrate opposite the semiconductor layer. The deformation compensation layers compensate for deformation of the structure that occurs while growing the semiconductor and buffer layers and deformation that occurs while cooling the structure. The method further includes estimating epitaxial growth stress, interface stress, and thermal stress of the structure, and adjusting the temperature and or thickness of the layers based on the estimated epitaxial growth stress, interface stress, and/or thermal stress.

17 Claims, 10 Drawing Sheets

(51) Int. Cl.

| | | |
|---|---|---|
| *C30B 25/18* | (2006.01) | |
| *C30B 29/40* | (2006.01) | |
| *H01L 23/29* | (2006.01) | |
| *H01L 23/31* | (2006.01) | |

(52) U.S. Cl.
CPC ...... *H01L 21/022* (2013.01); *H01L 21/02381* (2013.01); *H01L 21/02458* (2013.01); *H01L 21/02502* (2013.01); *H01L 21/0254* (2013.01); *H01L 23/3171* (2013.01); *H01L 23/3192* (2013.01); *H01L 21/02126* (2013.01); *H01L 21/0214* (2013.01); *H01L 21/02164* (2013.01); *H01L 21/02167* (2013.01); *H01L 21/0217* (2013.01); *H01L 21/02175* (2013.01); *H01L 23/291* (2013.01)

(58) Field of Classification Search
CPC ............. H01L 23/3171; H01L 23/3192; H01L 21/02126; H01L 21/0214; H01L 21/02164; H01L 21/02167; H01L 21/0217; H01L 21/02175; H01L 23/291; C30B 25/16; C30B 25/183; C30B 29/406
See application file for complete search history.

FEA Simulation Of Wafer Bow During Growth Phases

DEFORMATION COMPENSATION METHOD FOR GROWING THICK GALIUM NITRIDE ON SILICON SUBSTRATE

TECHNICAL FIELD

The present disclosure relates to structures including a semiconductor layer formed of gallium nitride on a substrate formed of a silicon-based material, and methods of manufacturing the structures.

BACKGROUND

Gallium nitride (GaN) is a favorable material for use as a semiconductor in power electronics. GaN based power devices are present in many consumer electronics, such as battery chargers, smartphones, automotive electronics, and more. GaN provides numerous advantages, such as higher energy efficiency, higher switching speed, and higher power density compared to other materials used as semiconductors in power electronics. GaN based power devices are generally much better than silicon (Si) based power electronics.

One approach to economically producing large diameter structures, also referred to as wafers, containing a GaN layer is to epitaxially grow the GaN on a substrate. GaN can be grown on different substrate materials such as silicon (Si), sapphire, and silicon carbide (SiC). A commonly used and cheaper substrate material is Si. However, epitaxial growth of thick GaN, such as a GaN layer having a thickness ranging from a few micrometers (m) to tens of micrometers (m), on Si is very challenging due to thermal expansion mismatch and material lattice mismatch. The thermal expansion mismatch and material lattice mismatch can cause deformation, which may be larger than the Si substrate plastic deformation limitation, or cracks that can damage or destroy the desired GaN layer.

One strategy used to mitigate the deformation is to grow various buffer layers between the substrate and GaN layer. For example buffer layers formed of AlN and/or $Al_xGa_{1-x}N$, wherein $0<x<1$, can be grown to help to mitigate some of the deformation. However, additional methods for mitigating deformation of the structures containing layers of GaN are desired.

SUMMARY

A method for manufacturing a structure, which includes a semiconductor layer formed of GaN applied to a substrate formed of a Si-based material, that includes mitigating or compensating for deformation of the structure is provided.

According to a first embodiment, the method of manufacturing the structure includes applying a semiconductor layer to a substrate, and applying at least one deformation compensation layer to the substrate opposite the semiconductor layer. The semiconductor layer is formed of GaN and the substrate is formed of a Si-based material. The at least one deformation compensation layer is formed of at least one of $SiO_2$, $SiC_xN_{(1-x)}$, SiN, $SiC_xO_{(1-x)}$, SiC, $SiN_xO_{(1-x)}$, $Al_2O_3$, and $Cr_2O_3$, wherein $0<x<1$.

According to a second embodiment, the method includes applying the semiconductor layer formed of the GaN to the substrate; and estimating at least one of epitaxial growth stress, interface stress, and thermal stress of the substrate, the semiconductor layer, and any other layers of the structure at a selected temperature and a selected thickness before, during, or after applying the layers to the substrate. The method further includes determining the temperature of the to be applied and/or the thickness of the layers to be applied based on at least one of the estimated epitaxial growth stress, the estimated interface stress, and the estimated thermal stress.

According to another embodiment, the structure includes the semiconductor layer disposed on the substrate. The semiconductor layer is formed of the GaN and has a thickness ranging from greater than 1 μm to 1000 μm. The substrate is formed of the Si-based material and has a plastic deformation limitation. The structure has a deformation of less than the plastic deformation limitation of the substrate.

DETAILED DESCRIPTION

Figure 1:
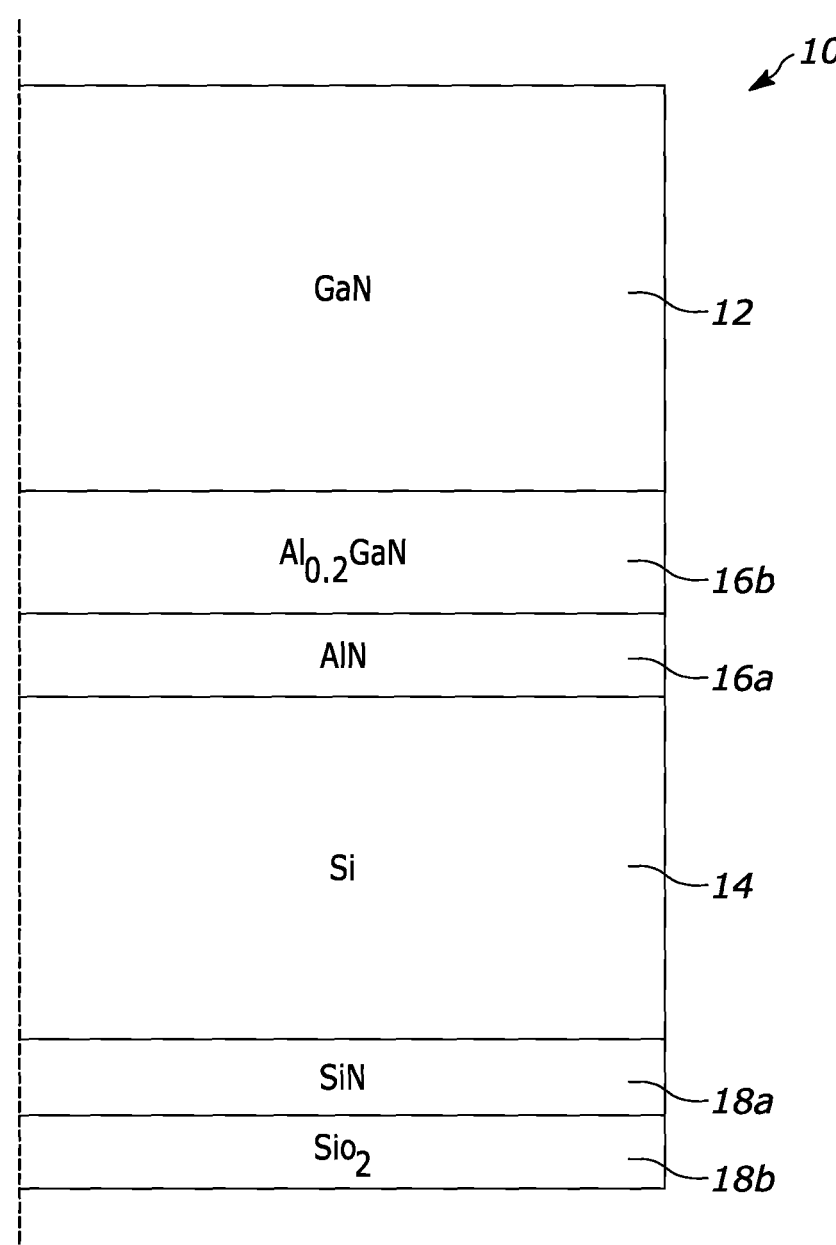
FIG. 1 shows a structure including a substrate, semiconductor layer, buffer layers, and deformation compensation layers according to an example embodiment.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

According to one embodiment, a method of manufacturing a structure 10 for use in power electronics, and more specifically a wafer including a semiconductor layer 12 formed of gallium nitride (GaN) disposed on a substrate 14 formed of a silicon (Si)-based material, is provided. The method is capable of manufacturing wafers having a GaN semiconductor layer 12 ranging from greater than 1 μm to 1000 μm in thickness without detrimental deformation, damage, or cracks in the GaN semiconductor layer 12. Any deformation present in the structure 10 formed by the method is less than the plastic deformation limitation of the substrate 14.

The Si-based material which is used to form the substrate 14 is preferably silicon, but can be Sapphire or silicon carbide. The substrate 14 has a thickness ranging from 30 μm to 1500 μm, more typically, 500 μm to 1500 μm, for example 900 μm to 1100 μm or 1000 μm.

The step of applying the semiconductor layer 12 to the substrate 14 includes epitaxial growth of the GaN on the substrate 14. The GaN is typically applied, deposited or grown on the substrate 14 at a temperature ranging from 900° C. to 1100° C., or 970° C. to 1030° C. The GaN is also preferably grown until it reaches a thickness ranging from less than 1 μm to greater than 50 μm, for example 0.1 μm to 100 μm, or 1 μm to 50 μm, or 5 μm to 15 μm, for example 10 μm.

In attempt to mitigate some of the deformation of the structure 10, the method includes applying or growing at least one buffer layer 16a, 16b between the substrate 14 and the semiconductor layer 12. Thus, before applying the semiconductor layer 12, as described above, the method preferably includes growing the at least one buffer layer 16a, 16b on the substrate 14, and then growing the semiconductor layer 12 on the at least one buffer layer 16a, 16b. The one or more buffer layers 16a, 16b are typically grown to a total thickness ranging from less than 0.1 μm to larger than 1 μm, for example 0.3 to 0.7 μm. The at least one buffer layer 16a, 16b is typically formed of AlN and/or $Al_xGa_{1-x}N$, wherein 0<x<1. For example, the method can including applying or growing a first buffer layer 16a formed of AlN on the substrate 14, and then growing a second buffer layer 16b formed of $Al_xGa_{(1-x)}N$, wherein 0<x<1, on the substrate 14. The first buffer layer 16a formed of AlN can be grown at a temperature ranging from 900° C. to 1100° C. or 970° C. to 1030° C., and to a thickness ranging from less than 0.1 μm to larger than 1 μm, or from 0.1 μm to 1 μm, or from 0.1 μm to 0.3 μm, for example a temperature of 1000° C. and 0.2 μm in thickness. The second buffer layer 16b can be grown at a temperature ranging from 900° C. to 1100° C. or from 940° C. to 1000° C., and to a thickness ranging from less than 0.1 μm to larger than 1 μm, or from 0.1 μm to 1 μm, or from 0.2 to 0.4 μm, for example a temperature of 970° C. and 0.3 μm in thickness.

The method includes heating the materials used to form the layers to the desired temperatures, for example the temperatures described above, and then applying the heated materials to form the layers. The structure including all of the layers is typically cooled after growing all of the layers. The layers and substrate are typically cooled to room temperature, or a temperature ranging from 15 to 25° C., for example 20° C.

During the steps of applying the layers and cooling the structure 10, the substrate 14, any buffer layers 16a, 16b, and the semiconductor layer 12 experience some deformation.

As explained above, the deformation of the structure 10 should be minimized in order to avoid damage or cracks in the GaN semiconductor layer 12, which could impair the performance of the structure 10 in the power electronic device. Any deformation present in the finished structure 10 formed by the method described herein is preferably less than the plastic deformation limitation of the substrate 14, and significant damage or cracks in the semiconductor layer 12 is avoided.

The deformation that occurs in the substrate 14 and layers 12, 16a, 16b corresponds to stress present in the substrate 10 and layers 12, 16a, 16b. More specifically, the deformation can be determined based on the stress. Factors that affect stress evolution inside the structure 10 include (a) thermal stress, which mainly comes from nonhomogeneous thermal expansion coefficients under the influence of temperature variation; (b) growth stress, which is closely related to microstructure evolution of the layers 12, 16a, 16b closely related to microstructure evolution of the layers 12, 16a, 16b during the material deposition process; and (c) interface stress, which comes from lattice mismatch between materials of the layers 12, 16a, 16b and substrate 14.

To accurately capture the stress evolution process during the method of manufacturing the structure, all the three stress sources should be considered. For the heating and cooling steps, the thermal stress is the dominate stress that can cause a structural response. For the growth process at a steady-state temperature, the microstructure evolution related growth stress and interface lattice mismatch stress are the dominate factors that affect the structural response.

Before, during, or after applying at least a portion of the at least one buffer layer 16a, 16b and/or the semiconductor layer 12 to the substrate 14, the method can include estimating at least one of epitaxial growth stress, interface stress, and thermal stress of the substrate 14 and of each of the layers 12, 16a, 16b at a selected temperature and a selected thickness. The stress of the structure 10 corresponds to the deformation of the structure 10, and thus the deformation of the structure 10 can be determined based on the various stress levels. The temperature at which the layers 12, 16a, 16b will be applied during the remainder of the process or during a future process can be based on the estimated epitaxial growth stress, the estimated interface stress, and/or the estimated thermal stress. The thickness of the layers 12, 16a, 16b to be grown during the present process or a future process can also be based on at least one of the estimated epitaxial growth stress, the estimated interface stress, and the estimated thermal stress.

The estimated epitaxial growth stress can be determined by a theoretical calculation, and the estimated interface stress is determined by a lattice constant at the selected temperature. The estimated thermal stress present in the structure can be determined by applying the following equations to each of the substrate 14 and layers 12, 16a, 16b:

$$\{\varepsilon\} = [D]^{-1}\{\sigma\} + \{\varepsilon^{th}\} \qquad \text{Equation 1}$$

$$\{\varepsilon^{th}\} = a_e \times \Delta T = a_e(T - T_{ref}) \qquad \text{Equation 2}$$

$$\{\sigma\} = [D]\{\varepsilon\} \qquad \text{Equation 3}$$

where $\{\varepsilon\}$ is overall strain, $\{\varepsilon^{th}\}$ is thermal strain, $\alpha_e$ is a material coefficient of thermal expansion (CTE), T is a selected temperature, $T_{ref}$ is a reference temperature, [D] is a strain-stress matrix, and $\{\sigma\}$ is a stress matrix.

The method can also include adjusting the temperature at which at least one of the layers 12, 16a, 16b is applied and/or the thickness of at least one of the layers 12, 16a, 16b based on at the estimated epitaxial growth stress, the estimated interface stress, and/or the estimated thermal stress.

According to one embodiment, in order to reduce deformation present in the finished structure 10, the method includes applying at least one deformation compensation layer 18a, 18b to the substrate 14 opposite the semiconductor layer 12 and any buffer layers 16a, 16b. An example of the structure 10 including a first deformation layer 18a and a second deformation compensation layer 18b is shown in FIG. 1. The at least one deformation compensation layer 18a, 18b is typically formed of at least one of $SiO_2$, $SiC_xN_{(1-x)}$, SiN, $SiC_xO_{(1-x)}$, SiC, $SiN_xO_{(1-x)}$, $Al_2O_3$, and $Cr_2O_3$, wherein $0<x<1$. The step of applying the at least one deformation compensation layer 18a, 18b includes growing the at least one deformation compensation layer 18a, 18b at a temperature ranging from 250° C. to 1200° C. and to a total thickness ranging from less than 1 μm to larger than 10 μm, or 1 μm to 10 μm, or 6 μm to 10 μm, for example 8 μm. The method also includes cooling the deformation compensation layers 18a, 18b with the entire structure 10 after all of the layers are applied.

The one or more deformation compensation layers 18a, 18b deform during the steps of applying the layers 12, 16a, 16b, 18a, 18b and cooling the structure 10. However, the temperatures, thicknesses, and materials of the layers 12, 16a, 16b, 18a, 18b used in the method are selected such that the deformation of the at least one deformation compensation layer 18a, 18b compensates for the deformation of any buffer layers 16a, 16b the substrate 14, and the semiconductor layer 12 that occurs during the steps of applying the layers 12, 16a, 16b, 18a, 18b and cooling the structure 10. The equations 1-3 described above can also be applied to the deformation compensation layers 18a, 18b.

The structure 10 including the substrate 14, the semiconductor layer 12, any deformation compensation layers 18a, 18b, and any buffer layers 16a, 16b, formed by the method described herein has a total deformation which is less than a plastic deformation limitation of the substrate 14. The plastic deformation limitation of the substrate 14 typically ranges from 450 to 550 μm when the structure 10 has diameter of 150 to 200 mm, and the deformation of the structure is thus typically not greater than 450 μm, preferably not greater than 350 μm. The deformation of the structure 10 changes depending on the diameter.

According to an example embodiment, the at least one deformation compensation layer 18a, 18b includes a first deformation compensation layer 18a formed of at least one of SiN, $SiC_xO_{(1-x)}$, SiC, $SiN_xO_{(1-x)}$, $Al_2O_3$, and $Cr_2O_3$, wherein $0<x<1$. The method can include growing the first deformation compensation layer 18a on the substrate opposite the semiconductor layer 12 at a temperature ranging from 200 to 400° C. or from 270 to 330° C., and to a thickness ranging from less than 1 to larger than 5 μm, for example 2 to 5 μm. For example, the first deformation compensation layer 18a can be SiN, applied at a temperature of 300° C. and grown to a thickness of 3 μm.

According to the example embodiment, the at least one deformation compensation layer 18a, 18b includes a second deformation compensation layer 18b formed of at least one of $SiO_2$ and $SiC_xN_{(1-x)}$, wherein $0<x<1$. The method can including growing the second deformation compensation layer 18b on the first deformation compensation layer 18a at a temperature ranging from 900 to 1100° C. or from 970 to 1030° C., and to a thickness ranging from less than 1 μm to larger than 10 μm, or from 1 μm to 10 μm, or from 3 to 7 μm. For example, the second deformation compensation layer 18b can be $SiO_2$, applied at a temperature of 1000° C. and grown to a thickness of 5 μm.

The at least one deformation compensation layer 18a, 18b can be applied to the substrate 14 after applying any buffer layer 16a, 16b and the semiconductor layer 12. Alternatively, the deformation compensation layer 18a, 18b can be applied to the substrate 14 before applying any buffer layer 16a, 16b or the semiconductor layer 12. The method can also include removing at least a portion of the at least one deformation compensation 18a, 18b layer from the substrate 14 after applying all of the layers 12, 16a, 16b, 18a, 18b. For example, the deformation compensation layers 18a, 18b can be removed by etching, or they can be thermally or chemically removed, wholly or partially.

According to one embodiment, the finished structure 10 includes the substrate 14 formed of the silicon-based material, and the semiconductor layer 12 formed of the GaN disposed on the substrate 14. The at least one deformation compensation layer 18a, 18b can be disposed on the substrate 14 opposite the semiconductor layer 12, and the at least one buffer layer 16a, 16b can be disposed between the substrate 14 and the semiconductor layer 12. The at least one buffer layer 16a, 16b can be formed of at least one of AlN and $Al_xGa_{(1-x)}N$, wherein $0<x<1$. The at least one deformation compensation layer 18a, 18b can be formed of at least one of $SiO_2$, $SiC_xN_{(1-x)}$, SiN, $SiC_xO_{(1-x)}$, SiC, $SiN_xO_{(1-x)}$, $Al_2O_3$, and $Cr_2O_3$, wherein $0<x<1$.

As described above, the substrate 14 typically has a thickness ranging from 30 μm to 1500 μm, for example 1000 μm. The semiconductor layer 12 typically has a thickness ranging from less than 1 μm to larger than 50 μm, for example 5 to 15 μm, or 10 μm. The at least one buffer layer 16a, 16b typically has a total thickness ranging from less than 0.1 μm to larger than 1 μm, or 0.1 μm to 1 μm, for example 0.3 to 0.7 μm. The at least one deformation compensation layer 18a, 18b has a thickness ranging from less than 1 μm to larger than 10 μm, or 1 μm to 10 μm, or 6 to 10 μm (or from less than 1 μm to larger than 10 μm), for example 8 μm.

According to one embodiment, the structure 10 includes the first buffer layer 16a disposed on the substrate 14 and having a thickness ranging from less than 0.1 μm to larger than 1 μm, for example 0.1 μm to 1 μm, or 0.1 to 0.3 μm. The first buffer layer 16a is preferably formed of AlN and has a thickness of 0.2 μm. The structure 10 also includes the second buffer layer 16b disposed on the substrate 14 between the first buffer layer 16a and the semiconductor layer 12. The second buffer layer 16b has a thickness ranging from less than 0.1 μm to larger than 1 μm, for example 0.1 μm to 1 μm, or 0.2 to 0.4 μm. The second buffer layer 16b is preferably formed of $Al_xGa_{(1-x)}N$, wherein $0<x<1$, and has a thickness of 0.3 μm.

According to one embodiment, the at least one deformation compensation layer 18a, 18b includes the first deformation compensation layer 18a disposed on the substrate 14 and formed of at least one of SiN, $SiC_xO_{(1-x)}$, SiC, $SiN_xO_{(1-x)}$, $Al_2O_3$, and $Cr_2O_3$, wherein $0<x<1$. The first deformation compensation layer 18a has a thickness ranging from less than 1 μm to larger than 5 μm, for example 2 to 5 μm. The first deformation compensation layer 18a is preferably SiN and has a thickness of 3 μm. According to the example embodiment, the at least one deformation compensation layer 18a, 18b includes the second deformation compensation layer 18b disposed on the first deformation compensation layer 18a and formed of at least one of $SiO_2$ and $SiC_xN_{(1-x)}$, wherein $0<x<1$. The second deformation compensation layer 18b has a thickness ranging from 3 to 7 μm. The second deformation compensation layer 18b is preferably $SiO_2$ and has a thickness of 5 μm.

The deformation compensation layers 18a, 18b, for example the SiN or $SiO_2$, can be location based, include multiple layers, and different thicknesses. For example, the deformation compensation layers 18a, 18b can be thicker along the edges and thinner in the middle to enhance bowing behavior. In addition, growth of the deformation compensation layers 18a, 18b can be on a gradient. For example, there can be more N(O) farther from the Si—SiN (Si—$SiO_2$) interface, to enhance stability. As discussed above, at least portion of the deformation compensation layers 18a, 18b may be removed in the finished structure 10.

The diameter of the structure 10 can vary depending on the intended us of the structure 10, for example the specific power electronic design. However, according to one embodiment, the diameter of the structure 10 ranges from 50 to 100 millimeters (mm), for example 75 mm.

As discussed above, the structure 10, including the substrate 14, the semiconductor layer 12, any buffer layer 16a, 16b, and any deformation compensation layer 18a, 18b have a total deformation which is less than a plastic deformation limitation of the substrate 14. The plastic deformation limitation of the substrate 14 typically ranges from 450 to 550 μm, and thus the deformation of the structure 10 is typically not greater than 450 μm, preferably not greater than 350 μm. Experiment—Part I.

Figure 2:
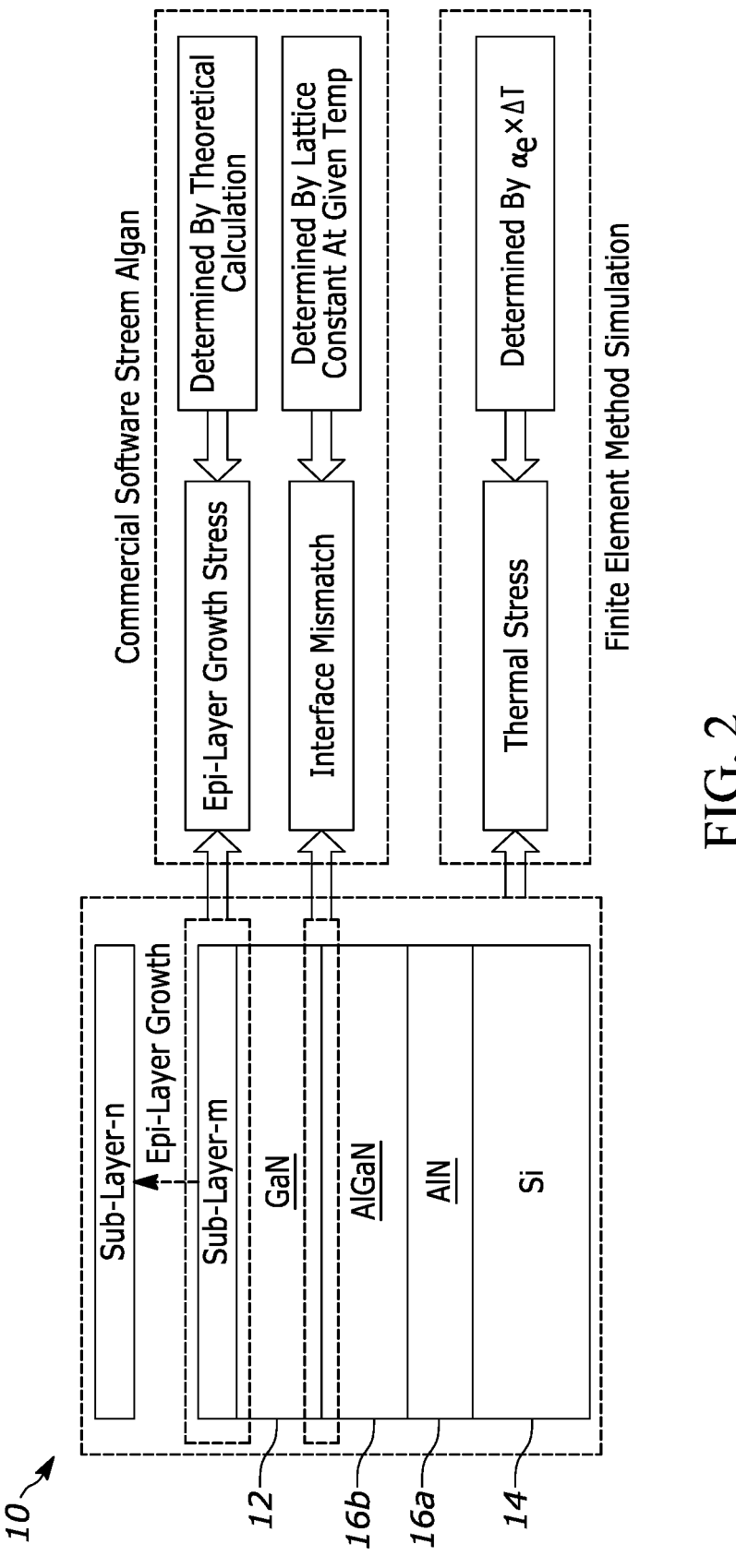
FIG. 2 shows a general modeling structure for calculating stress in the substrate and layers during the process of manufacturing the structure according to an example embodiment.

An experiment was conducted to investigate a 3-layer simple stack configuration. The structure 10 investigated included a substrate 14 formed of silicon, a first buffer layer 16a formed of AlN, a second buffer layer 16b formed of $Al_xGa_{(1-x)}N$, where $0<x<1$, and a semiconductor layer 12 formed of GaN. A general modeling structure was used to calculate stress occurring in the substrate and layers during the process of manufacturing the structure. This modeling structure is shown in FIG. 2. The epitaxial growth stress and interface stress was calculated by software, specially the commercial software known as STREEM AlGaN. Due to temperature variation in the epitaxial growth process, thermal stresses and distortions were generated in the structure. The thermal stress was mainly determined by finite element method simulation. Only elastic deformation was considered in this experiment. The equations 1-3 disclosed above were used to relate temperature, thermal strain and stress.

Figure 3:
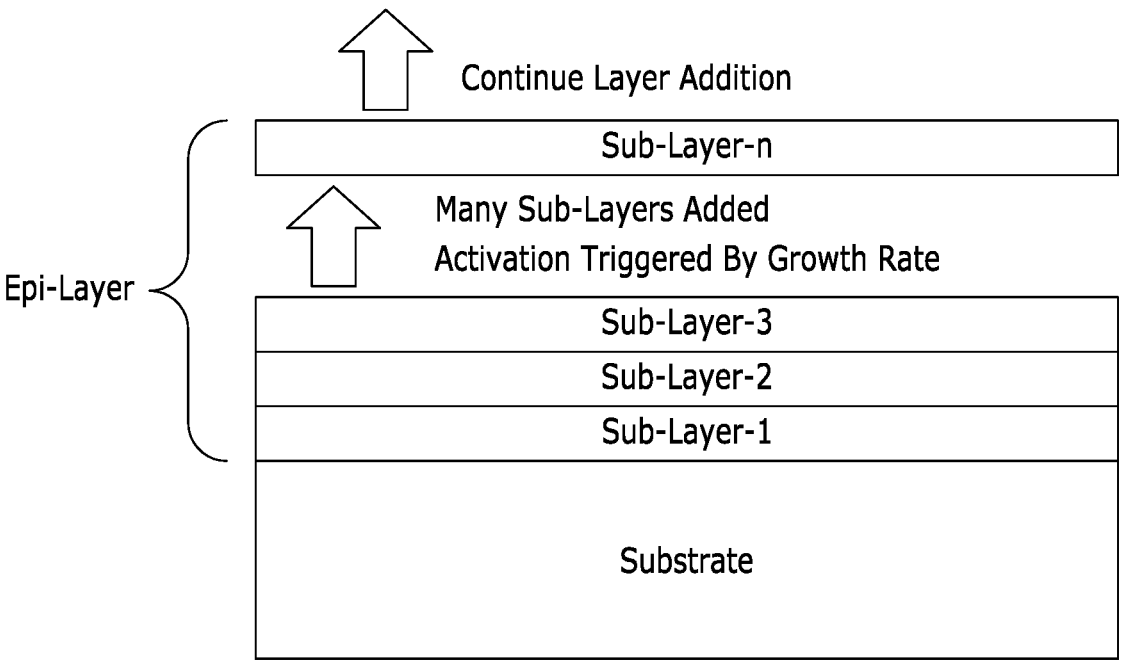
FIG. 3 a schematic plot of a two-dimensional finite element analysis (FEA) thermomechanical model.

A two-dimensional finite element analysis (FEA) thermo-mechanical model was then developed to simulate the deformation occurring in the epitaxial growth process of a layered structure. FIG. 3 shows the general technique required in the model. More specifically, FIG. 3 is a schematic plot of finite layer progressive activation and analysis for the epi-growth process. The structure 10 analyzed included a semiconductor layer 12 formed of the GaN and a substrate 14 formed of silicon. The structure 10 analyzed also included a first buffer layer 16a formed of the AlN, and a second buffer layer 16b formed of the $Al_{0.2}Ga_{0.8}N$. The finite layer progressive activation and analysis was applied to mimic the nature of a nano-scale sub-layer-wise epi-growth process. A thin sub-layer, on the top of the currently already deposited layers, was assumed to be the latest grown sub-layer and was added and activated when the corresponding growth height was reached. The growth stress for the corresponding growth height was implemented together with sub-layer activation. However, the model could not represent the actual nano-scale layer-wise epi-growth process since such process requires hundreds of thousands of nano-scale sub-layers. Only a limited number of layers was simulated. For each layer, a sub-layer was set to consist of several real nano-scale atomistic layers. Growth stress and interface stress from the theoretical calculation was implemented during the sub-layer sequential activation process.

Figure 4:
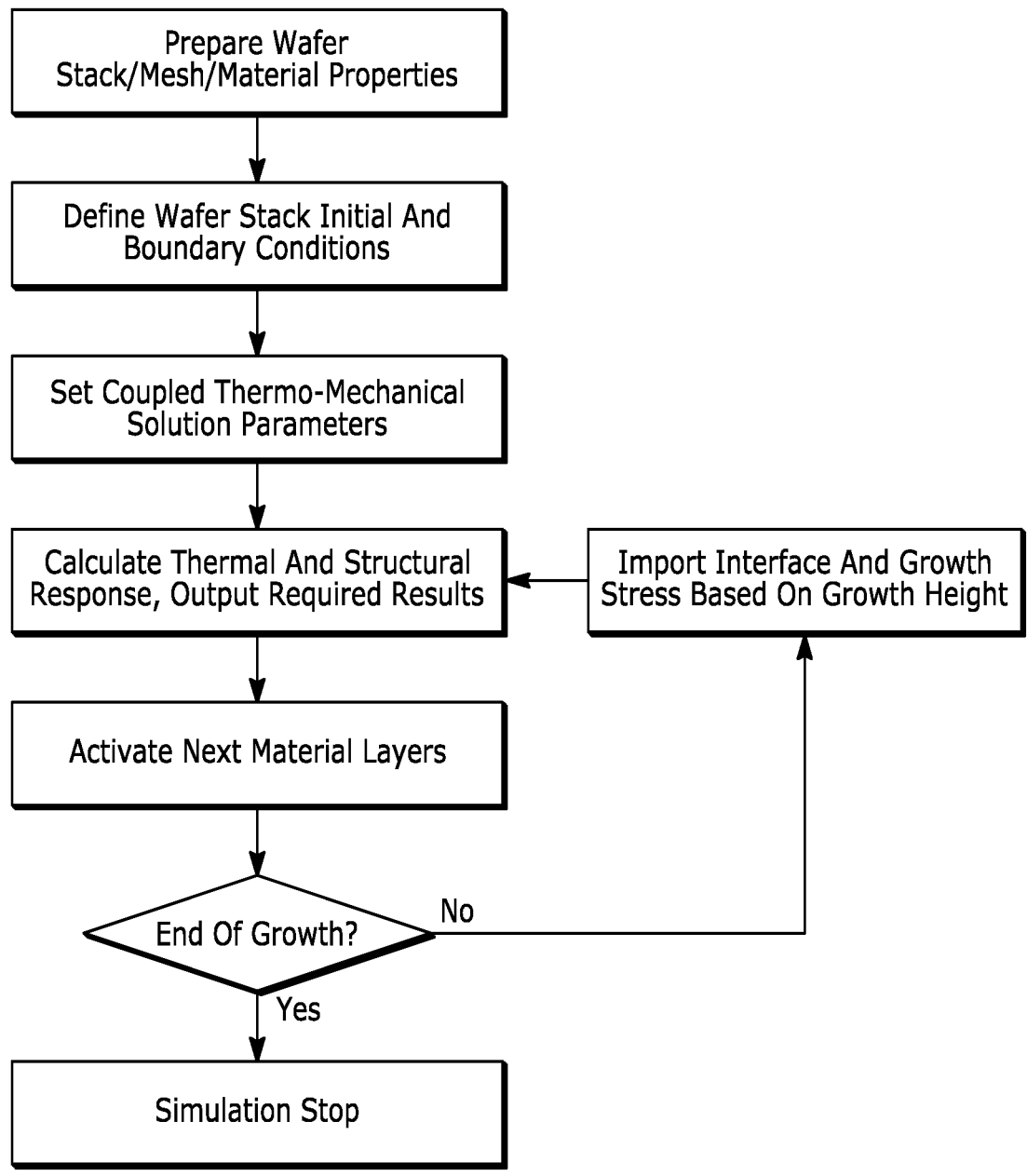
FIG. 4 is a flow chart of a numerical procedure of the FEA model.

FIG. 4 is a flow chart of a numerical procedure of the FEA model. Coupled temperature-displacement elements were used for the whole model. A finer mesh was used for the epi-layers to directly incorporate the corresponding growth stress while coarser mesh was used in substrate regions away from the high stress zone. The meshing method can help to save computational time and maintain reasonable simulation accuracy.

Figure 5:
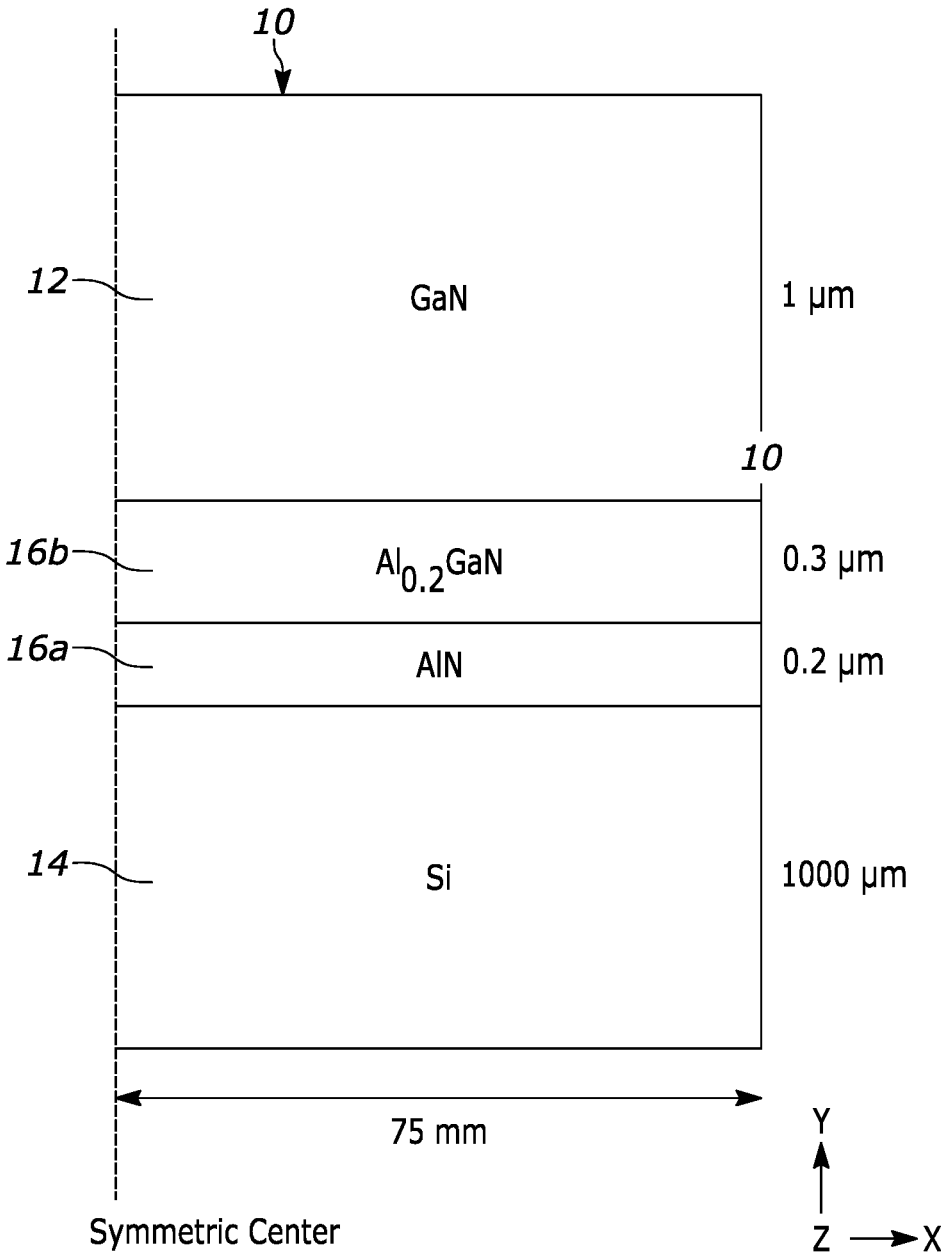
FIG. 5 shows a structure including a substrate, semiconductor layer, and buffer layers according to an example embodiment.

The experiment also included validation of the model disclosed above. This portion of the experiment included a simulation of the structure 10 including the semiconductor layer 12 formed of GaN, the first buffer layer 16a formed of the AlN, and the second buffer layer 16b formed of the $Al_{0.2}Ga_{0.8}N$, as shown in FIG. 5. The first buffer layer 16a formed of the AlN was deposited at 1000° C., the second buffer layer 16b formed of the $Al_{0.2}Ga_{0.8}N$ was deposited at 970° C., and the semiconductor layer 12 formed of the GaN was deposited at 1000° C. The substrate 14 had a thickness of 1000 μm, the semiconductor layer 12 was grown to a thickness of 1 μm, the first buffer layer 16a was grown to a thickness of 0.2 μm, the second buffer layer 16b was grown to a thickness of 0.3 μm. After the epi-layer growth was finished, the entire structure 10 was gradually cooled down to room temperature, specifically 20° C.

Figure 6:
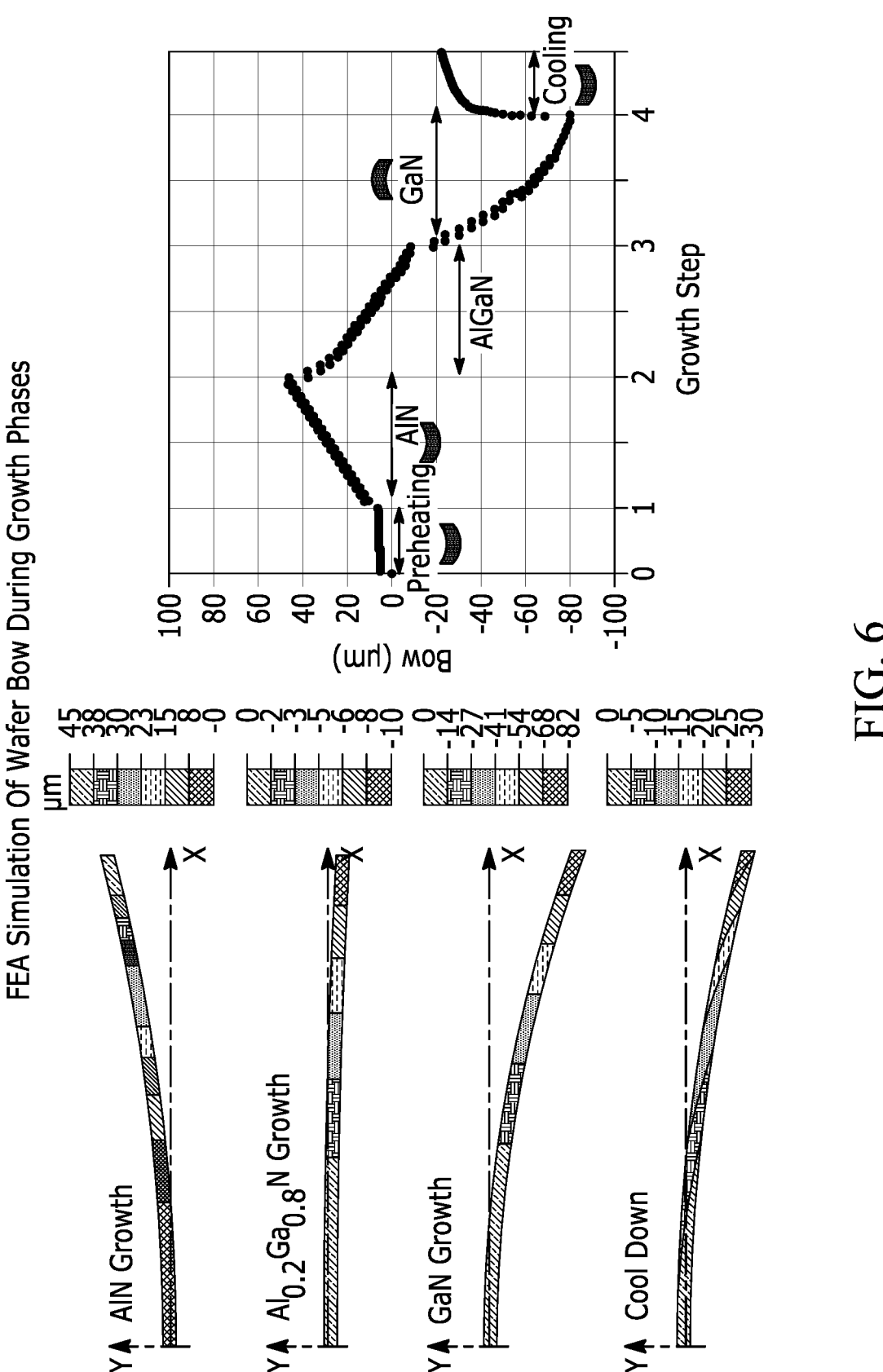
FIG. 6 includes additional design and growth condition information and results of a simulation.

FIG. 6 includes additional design and growth condition information and results. The simulation results of FIG. 6 show if the wafer deforms toward the negative Y axis, it is a negative deformation and is called convex deformation; and if the wafer deforms toward the positive Y axis, it is a positive deformation and is called concave deformation. It was observed that concave deformation resulted from the AlN growth phase since tensile stress was created from the AlN epi-layer growth. The growth of $Al_{0.2}Ga_{0.8}N$ and GaN led to compressive stress in epi-layers, and thus convex deformation was observed. Thermal stress due to material thermal expansion misfit at the final cooling phase caused tensile stress which helped the structure deform toward positive direction.

Figure 7:
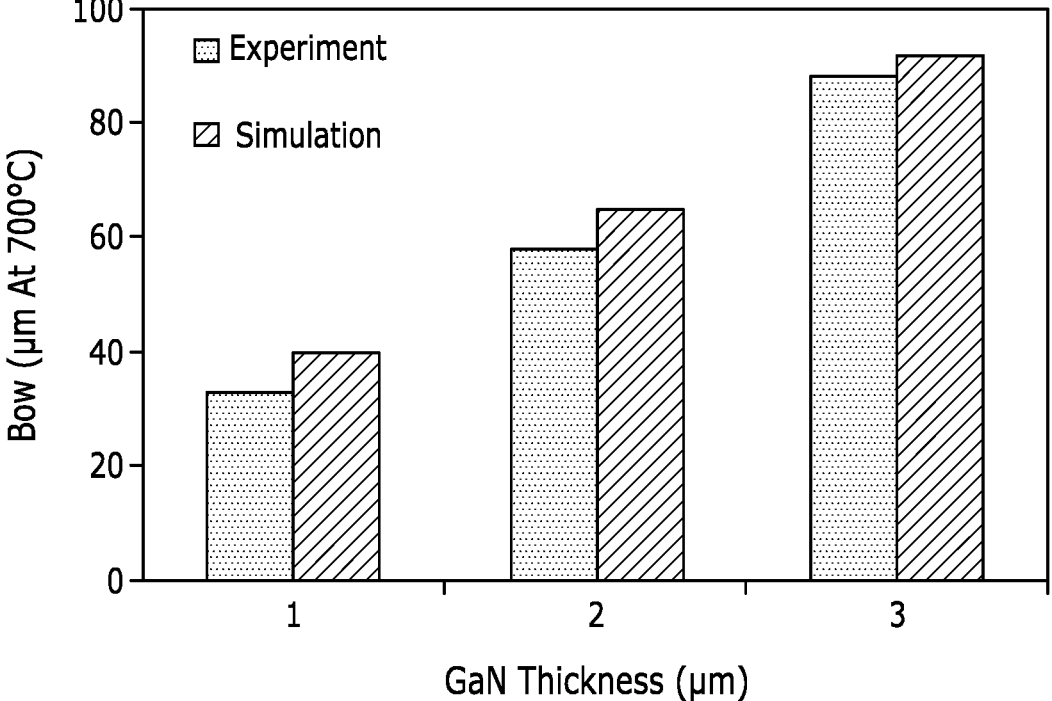
FIG. 7 summarizes bow magnitude at 700° C. of experiments and simulations for various GaN thicknesses.

To validate the developed model, experiments were performed to measure the structure deformation magnitude at elevated temperatures. The finished structures (with various GaN epi-layer thicknesses) were uniformly heated up to 700° C. and the bows were recorded. The max bow deformation magnitudes, e.g. bow values between 700° C. and 20° C., were used for comparison against simulations. FIG. 7 summaries the bow magnitude at 700° C. of both experiments and simulations for various GaN thicknesses (1 μm, 2 μm, and 3 m), where the max error was <20%. Therefore, it was concluded that the model is valid and can be used for subsequent simulations.

The next portion of the experiment utilized temperature-induced substrate deformation to compensate for the deformation occurring during the step of growing the GaN semiconductor layer. More specifically, the study investigated the effect of sequentially deposited materials with distinctive coefficients of thermal expansion (CTEs) at various temperatures on the final structure deformation.

Figure 8:
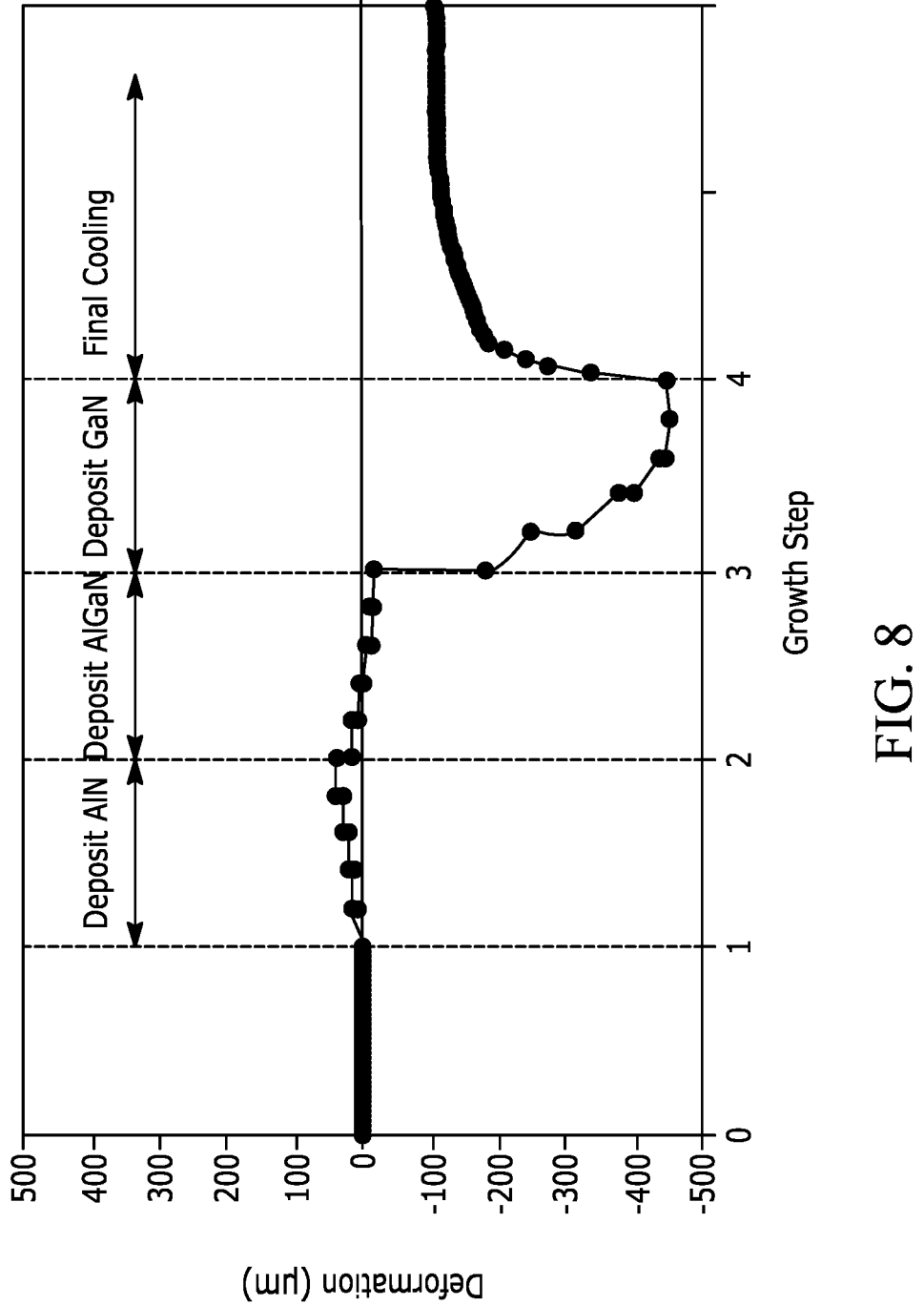
FIG. 8 is a graph showing deformation resulting from growth of a semiconductor layer formed of a GaN on a Si substrate according to an example embodiment.

FIG. 8 is a graph showing deformation resulting from growth of a semiconductor layer formed of the GaN to a thickness of 10 μm on the Si substrate having a thickness of 1 mm and a diameter of 150 mm. The buffer layers (AlN and $Al_{0.2}Ga_{0.8}N$) and growth temperatures were the same as the structures described in the experiment above. It was observed that the negative deformation which occurred during the GaN growth can reach ~450 μm, which is close to or exceeds the plastic deformation of the 1 mm Si substrate used in the simulation. Therefore, it was determined that the process would result in large final bow deformation after the structure cools down to room temperature.

Experiment—Part II.

The second part of the experiment tested pre-deformation during the GaN growth phase and post-deformation compensation during the cooling step to avoid problems associated with the plastic limitation and large final bow.

Figure 9:
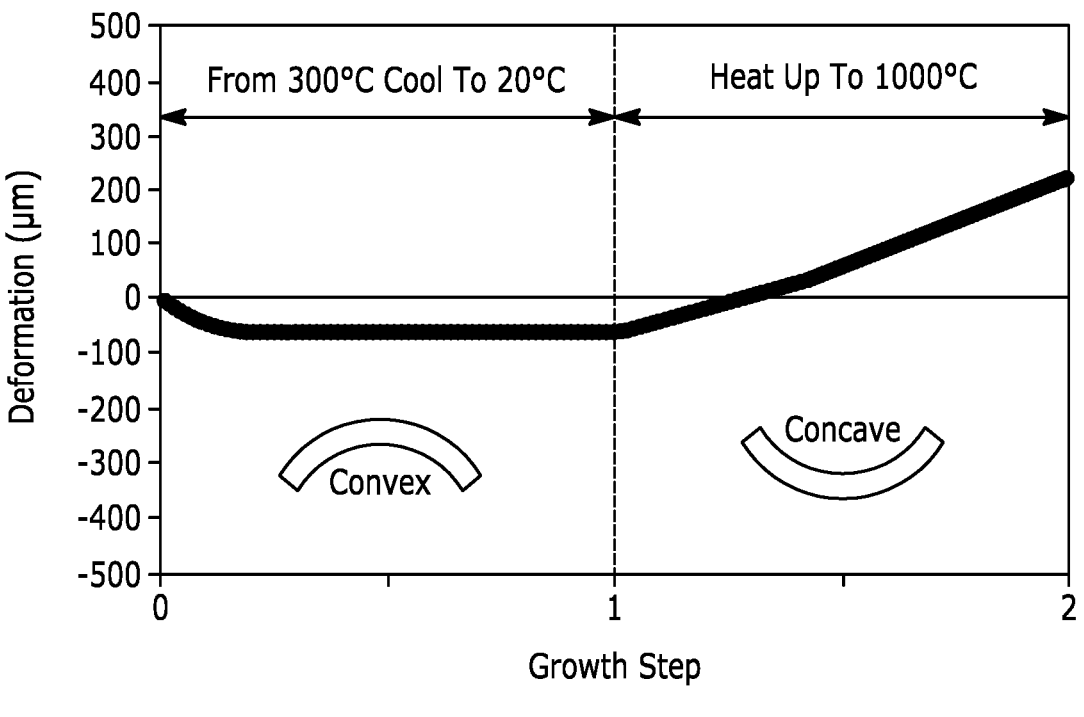
FIG. 9 is a graph showing deformation resulting from growth of a deformation compensation layer formed of a SiN on a Si substrate according to an example embodiment.

The experiment included growing a high CTE deformation compensation layer formed of SiN (SiN CTE>Si CTE) on the bottom of Si substrate at a low temperature, specifically 300° C. During the cooling phase to 20° C., the deformation compensation layer generated a negative deformation thus forming a convex bow. During the heating phase which was 20° C. to the GaN growth temperature of about 1000° C., a concave bow was developed, as shown in FIG. 9. The pre-deformed positive bow was used to compensate for the negative deformation created during the GaN growth process.

Figure 10:
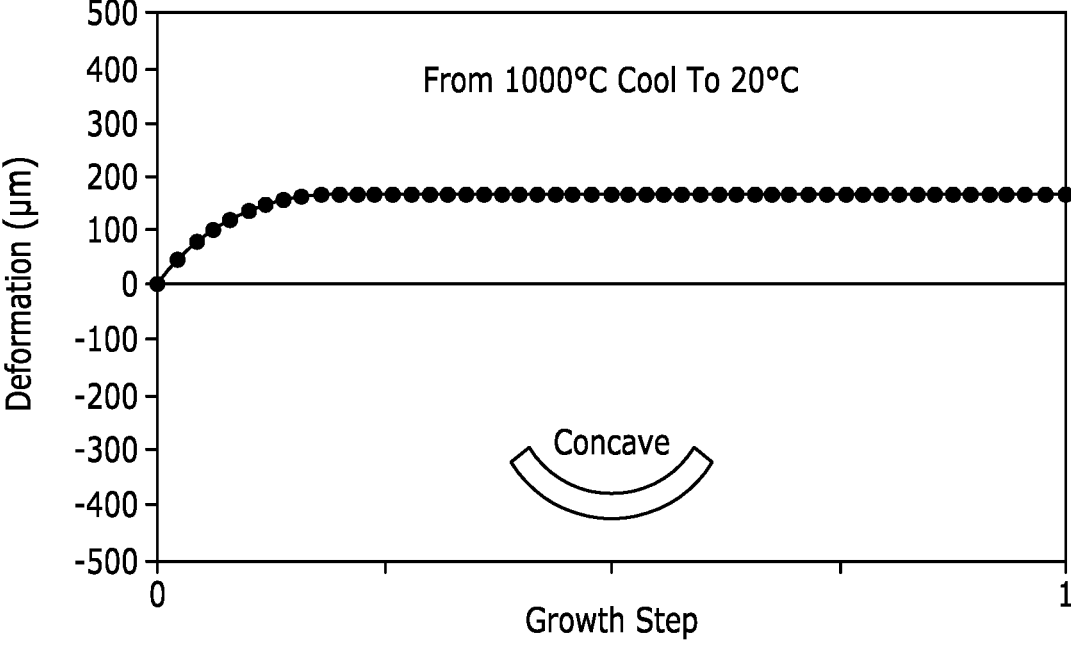
FIG. 10 is a graph showing deformation resulting from growth of a deformation compensation layer formed of a $SiO_2$ on a Si substrate according to an example embodiment.

Next, post-deformation compensation which occurs during the cooling phase was tested. A low CTE deformation compensation layer formed of SiO₂ (SiO₂ CTE<Si CTE) was grown on the bottom of the Si substrate at a high temperature of 1000° C. and then the structure was cooled down to room temperature of 20° C. The thermal expansion misfit caused positive deformation thus forming a concave bow, as shown in FIG. 10. The pre-deformed positive bow was used to compensate for the deformation created during the final cooling process.

Therefore, it was concluded that the correct combination of the pre-deformation compensation and the post-deformation compensation described above with a carefully chosen material thicknesses would help to mitigate the GaN growth deformation at high temperatures as well as wafer cooling deformation at low temperatures.

Experiment—Part III.

A simulation example was conducted to demonstrate the effectiveness of the method described above including the pre-deformation compensation and the post-deformation compensation. The structure of the simulation is shown in FIG. 1. The first buffer layer 16a formed of the AlN was deposited at 1000° C., the second buffer layer 16b formed of the Al₀.₂Ga₀.₈N was deposited at 970° C., and the semiconductor layer 12 formed of the GaN was deposited at 1000° C. The substrate 14 had a thickness of 1000 μm, the semiconductor layer 12 was grown to a thickness of 10 μm, the first buffer layer 16a was grown to a thickness of 0.2 μm, the second buffer layer 16b was grown to a thickness of 0.3 μm. In addition, first deformation compensation layer formed of SiN and having a thickness of 3 μm was grown at the bottom of the Si substrate at 300° C., and a second deformation compensation layer formed of SiO₂ and having a thickness of 5 μm was grown at the bottom of the first deformation compensation layer at a temperature of 1000° C. The structure 10 was symmetric and had a diameter of 75 mm. The growth thicknesses and the growth temperatures disclosed herein were examples but the method is not limited to those examples. Based on availability of actual process techniques and the GaN thickness (e.g., a few μm to tens of μm), it was determined that the SiN growth temperature can be about 250° C. to about 400° C., and the SiO₂ growth temperature can be about 800° C. to about 1000° C.

It was also determined that the corresponding material thickness should be adjusted as well to achieve a reasonable deformation compensation.

Figure 11:
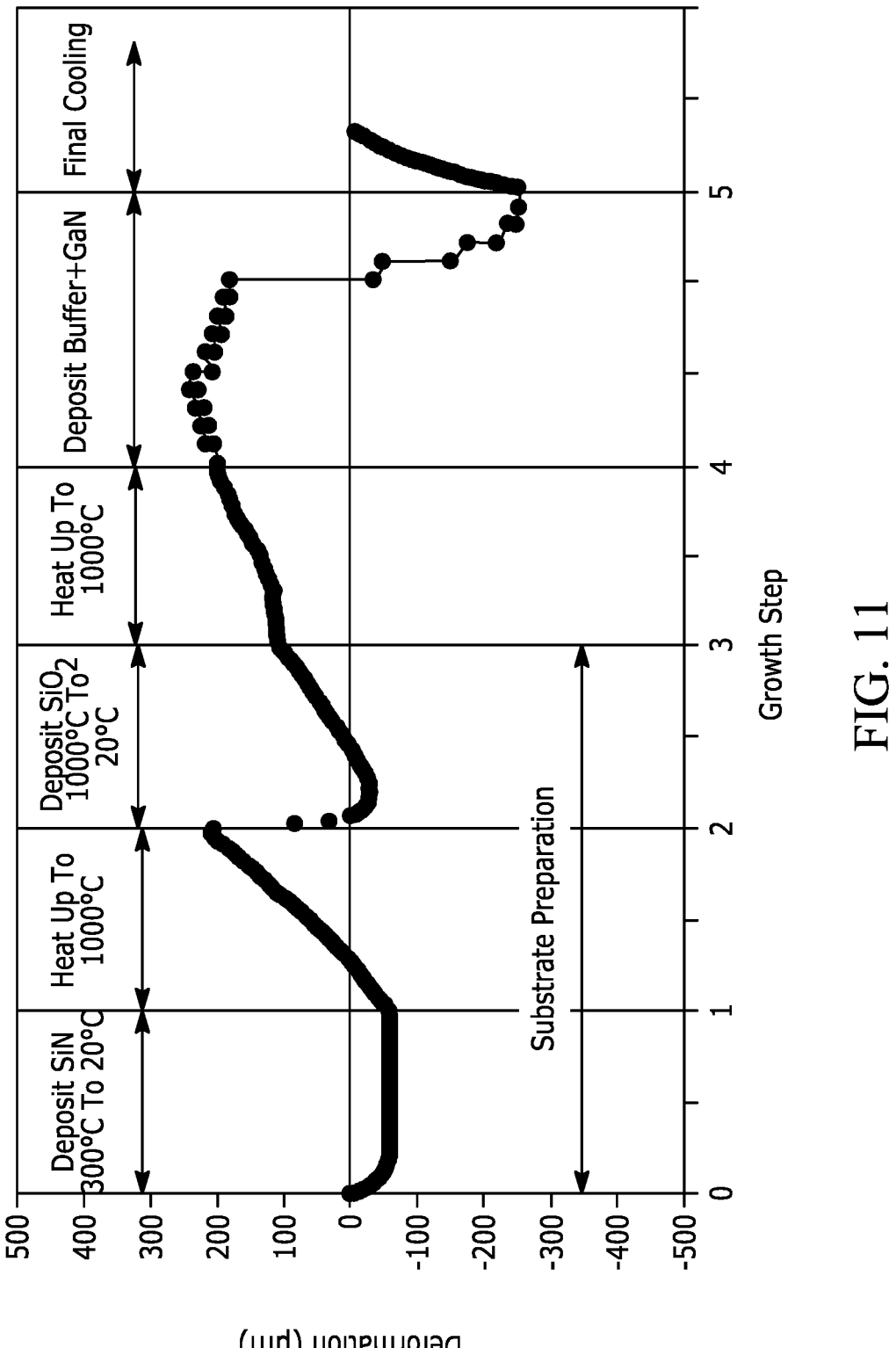
FIG. 11 is a graph showing deformation resulting from growing a semiconductor layer, buffer layers, and deformation compensation layers on a substrate according to an example embodiment.

The simulation results showed that the deposited deformation compensation layers at the bottom of substrate helped to shift the curve of deformation caused by the GaN growth process up so that the final deformation was below the plastic limitation of the substrate. The process deformation plot is shown in FIG. 11. Specifically, at 1000° C., the deformation due to thermal mismatch contributed by 3 μm thick SiN was about +220 μm, which helped to shift the maximum negative deformation from about 450 μm to about 250 μm, which was below the Si substrate plastic deformation limitation. In addition, the deformation due to thermal mismatch contributed by the 5 μm thick SiO₂ helped to bring the structure to a flat level during the final cooling phase.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A method of manufacturing a structure, comprising the steps of:

applying a semiconductor layer to a substrate;

the semiconductor layer being formed of gallium nitride (GaN), and the substrate being formed of a silicon-based material;

applying at least one deformation compensation layer to the substrate opposite the semiconductor layer;

the at least one deformation compensation layer being formed of at least one of SiO₂, SiCₓN₍₁₋ₓ₎, SiN, SiCₓO₍₁₋ₓ₎, SiC, SiNₓO₍₁₋ₓ₎, Al₂O₃, and Cr₂O₃, wherein 0<x<1;

estimating at least one of (a) an epitaxial growth stress, (b) an interface stress, and (c) a thermal stress of the substrate and each of the semiconductor layer and the at least one deformation compensation layer at a selected temperature and a selected thickness before, during, or after the steps of applying the semiconductor layer and applying at least one deformation compensation layer; and determining the temperature at which the semiconductor layer and the at least one deformation compensation layer will be applied and/or the thickness of the semiconductor layer and the at least one deformation compensation layer to be applied based on at least one of the estimated epitaxial growth stress, the estimated interface stress, and the estimated thermal stress;

wherein the estimated thermal stress is determined by applying the following equations for each of the substrate, the semiconductor layer, and the at least one deformation compensation layer:

$$\{\varepsilon\} = [D]^{-1}\{\sigma\} + \{\varepsilon^{th}\},$$

$$\{\varepsilon^{th}\} = a_e \times \Delta T = a_e(T - T_{ref}), \text{ and}$$

$$\{\sigma\} = [D]\{\varepsilon\},$$

where $\{\varepsilon\}$ is overall strain, $\{\varepsilon^{th}\}$ is thermal strain, $\alpha_e$ is a material coefficient of thermal expansion (CTE), T is a selected temperature, $T_{ref}$ is a reference temperature, [D] is a strain-stress matrix, and $\{\sigma\}$ is a stress matrix.

2. The method according to claim 1, wherein the step of applying the semiconductor layer includes epitaxial growing of the GaN on the substrate.

3. The structure according to claim 1, wherein the semiconductor layer has a thickness ranging from greater than 1 micrometer ($\mu$m) to 1000 $\mu$m.

4. The method according to claim 1, wherein deformation of the structure is not greater than 450 $\mu$m when the structure has a diameter ranging from 150 mm to 200 mm.

5. The method according to claim 1 including applying at least one buffer layer between the substrate and the semiconductor layer, wherein the at least one buffer layer includes at least one of AlN and $Al_xGa_{(1-x)}N$, wherein 0<x<1.

6. The method according to claim 1, wherein deformation of the at least one deformation compensation layer which occurs during the steps of applying the semiconductor layer and the at least one deformation compensation layer compensates for deformation of the semiconductor layer and any buffer layers located between the semiconductor layer and the substrate which occurs during the steps of applying the semiconductor layer, the at least one deformation compensation layer, and the buffer layers.

7. A structure formed according to the method of claim 1, the structure comprising:

a substrate formed of a silicon-based material, the substrate having a plastic deformation limitation;

a semiconductor layer disposed on the substrate, the semiconductor layer being formed of gallium nitride (GaN) and having a thickness ranging from greater than 1 $\mu$m to 1000 $\mu$m; and the structure, including the semiconductor layer and the substrate together, having a total deformation of less than the plastic deformation limitation of the substrate.

8. The structure according to claim 7 including at least one deformation compensation layer disposed on the substrate opposite the semiconductor layer, the at least one deformation compensation layer being formed of at least one of $SiO_2$, $SiC_xN_{(1-x)}$, SiN, $SiC_xO_{(1-x)}$, SiC, $SiN_xO_{(1-x)}$, $Al_2O_3$, and $Cr_2O_3$, wherein 0<x<1.

9. The structure according to claim 8, wherein the at least one deformation compensation layer includes a first deformation compensation layer formed of at least one of SiN, $SiC_xO_{(1-x)}$, SiC, $SiN_xO_{(1-x)}$, $Al_2O_3$, and $Cr_2O_3$, wherein 0<x<1; and the at least one deformation compensation layer includes a second deformation compensation layer disposed on the first deformation compensation layer and being formed of at least one of $SiO_2$ and $SiC_xN_{(1-x)}$, wherein 0<x<1.

10. The structure according to claim 9, wherein the first deformation compensation layer is formed of SiN and the second deformation compensation layer is formed of $SiO_2$.

11. The structure according to claim 7 including at least one buffer layer disposed between the substrate and the semiconductor layer, wherein the at least one buffer layer includes at least one of AlN and $Al_xGa_{(1-x)}N$, wherein 0<x<1.

12. The structure according to claim 11, wherein the at least one buffer layer includes a first buffer layer formed of AlN and a second buffer layer formed of $Al_xGa_{(1-x)}N$, wherein 0<x<1.

13. The structure according to claim 7, wherein the total deformation of the structure is not greater than 450 $\mu$m when the structure has a diameter ranging from 150 mm to 200 mm.

14. The structure according to claim 13, wherein the total deformation of the structure is not greater than 350 $\mu$m when the structure has a diameter ranging from 150 mm to 200 mm.

15. The structure according to claim 13 including at least one buffer layer disposed between the substrate and the semiconductor layer, wherein the at least one buffer layer includes at least one of AlN and $Al_xGa_{(1-x)}N$, wherein 0<x<1.

16. The method according to claim 1, wherein the structure, including the semiconductor layer, the at least one deformation compensation layer, and the substrate together, has a total deformation which is less than a plastic deformation limitation of the substrate.

17. A method of manufacturing a structure, comprising the steps of:

applying a semiconductor layer to a substrate;

the substrate being formed of a silicon-based material and the semiconductor layer being formed of GaN; and estimating at least one of an epitaxial growth stress, an interface stress, and a thermal stress of the substrate, the semiconductor layer, and any other layers of the structure at a selected temperature and a selected thickness before, during, or after applying the layers to the substrate; and determining the temperature at which the semiconductor layer, and any other layers will be applied and/or the thickness of the semiconductor layer, and any other layers to be applied based on at least one of the estimated epitaxial growth stress, the estimated interface stress, and the estimated thermal stress, wherein the estimated thermal stress is determined by applying the following equations for the substrate, the semiconductor layer, and any other layers:

$$\{\varepsilon\} = [D]^{-1}\{\sigma\} + \{\varepsilon^{th}\},$$

$$\{\varepsilon^{th}\} = a_e \times \Delta T = a_e(T - T_{ref}),$$

$$\{\sigma\} = [D]\{\varepsilon\},$$

where $\{\varepsilon\}$ is overall strain, $\{\varepsilon^{th}\}$ is thermal strain, $\alpha_e$ is a material coefficient of thermal expansion (CTE), T is a selected temperature, $T_{ref}$ is a reference temperature, [D] is a strain-stress matrix, and $\{\sigma\}$ is a stress matrix.

* * * * *